(12) United States Patent
Liu (10) Patent No.: US 7,661,463 B2
(45) Date of Patent: Feb. 16, 2010

(54) COOLING DEVICE INCORPORATING BOILING CHAMBER

(75) Inventor: Tay-Jian Liu, Tu-Cheng (TW)

(73) Assignee: Foxconn Technology Co., Ltd., Tu-Cheng, Taipei Hsien (TW)

(*) Notice: Subject to any disclaimer, the term of this patent is extended or adjusted under 35 U.S.C. 154(b) by 452 days.

(21) Appl. No.: 11/166,313

(22) Filed: Jun. 24, 2005

(65) Prior Publication Data
US 2006/0118280 A1  Jun. 8, 2006

(30) Foreign Application Priority Data
Dec. 3, 2004 (TW) .............................. 93137371 A (51) Int. Cl.
F28D 15/04 (2006.01)
H05K 7/20 (2006.01)
(52) U.S. Cl. .............................. 165/104.14; 165/104.26; 165/104.33; 257/715; 361/700
(58) Field of Classification Search ............ 165/104.33, 165/80.3, 80.4, 104.26, 104.14; 361/700, 361/695, 697, 698, 699; 257/714, 715; 174/15.1, 174/15.2, 16.1, 16.3
See application file for complete search history.

(56) References Cited

U.S. PATENT DOCUMENTS

| | | | |
|---|---|---|---|
| 3,991,396 A * | 11/1976 | Barkan | 257/715 |
| 4,135,367 A * | 1/1979 | Frosch et al. | 165/104.26 |
| 5,305,184 A * | 4/1994 | Andresen et al. | 165/104.33 |
| 5,427,174 A | 6/1995 | Lomolino et al. | |
| 6,714,413 B1 * | 3/2004 | Ghosh et al. | 361/700 |
| 6,808,013 B2 * | 10/2004 | Lai et al. | 165/104.33 |
| 6,820,684 B1 | 11/2004 | Chu et al. | |
| 2002/0029873 A1 * | 3/2002 | Sugito et al. | 165/166 |
| 2002/0118511 A1 | 8/2002 | Dujari et al. | |
| 2002/0179284 A1 * | 12/2002 | Joshi et al. | 165/104.33 |
| 2003/0205363 A1 * | 11/2003 | Chu et al. | 165/80.3 |
| 2004/0069451 A1 | 4/2004 | Meyer | |
| 2004/0100771 A1 * | 5/2004 | Luo | 361/700 |

* cited by examiner

Primary Examiner—Leonard R Leo
(74) Attorney, Agent, or Firm—Frank R. Niranjan (57) ABSTRACT

A cooling device includes a boiling chamber containing working fluid therein. The chamber includes a bottom wall for contacting with a heat generating component and a cover hermetically connected with the bottom wall. The cover includes a top wall and a bulge formed at a periphery thereof. The bulge includes a pair of spaced side walls, one of the side walls connecting with the top wall and the other of the side walls connecting with the bottom wall. A buffering region is formed between the side walls, which is capable of absorbing agitation wave generated by boiling fluid to thereby allow the boiling fluid to be capabling of continuously and stably contacting with and exchanging heat from the top wall of the boiling chamber when the fluid boils. A heat sink is arranged on the cover of the boiling chamber for transferring heat from the boiling chamber to environment.

14 Claims, 9 Drawing Sheets

COOLING DEVICE INCORPORATING BOILING CHAMBER

TECHNICAL FIELD

The present invention relates to a cooling device, and particularly to a cooling device incorporating a boiling chamber.

BACKGROUND

As electronic industry continues to advance, electronic components such as central processing units (CPUs), are made to provide faster operational speeds and greater functional capabilities. When a CPU operates at a high speed, its temperature frequently increases greatly. It is desirable to dissipate the heat generated by the CPU quickly. To solve this problem of heat generated by the CPU, a cooling device is often used to be mounted on top of the CPU to dissipate heat generated thereby.

A conventional cooling device comprises a heat sink with a base for contacting with the CPU to absorb heat therefrom and a fan mounted on the heat sink for generating forced airflow to the heat sink to thereby enhance the heat dissipation capability of the heat sink. However, as the CPU operates more and more fast and therefore generates larger and larger heat the conventional heat sink, which transfers heat via heat conduction means, cannot meet the increased heat dissipating requirement of the CPU. Subsequently, heat pipes have been developed to be incorporated into the heat sink for improving heat dissipation capability of the heat sink. However, the improving effect of the heat pipe is limited due to the CPU has a small heat dissipation surface which limits the number of the used heat pipe. Furthermore, some heat pipes may not work normally in inclined state in which the capillary action of capillary structure arranged inside the heat pipe is affected by the gravity.

Figure 13:
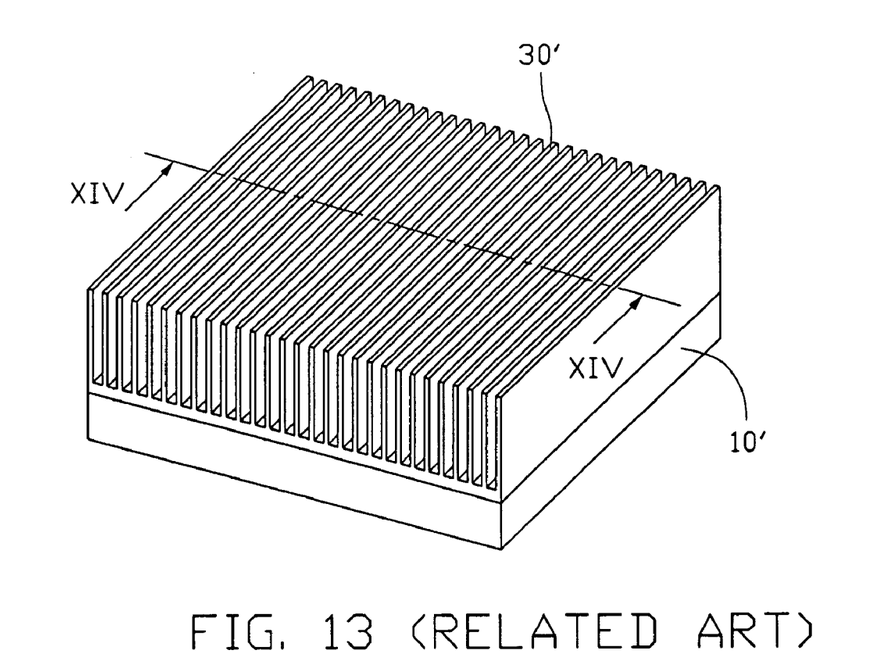
FIG. 13 is an isometric view of a conventional cooling device.
Figure 14:
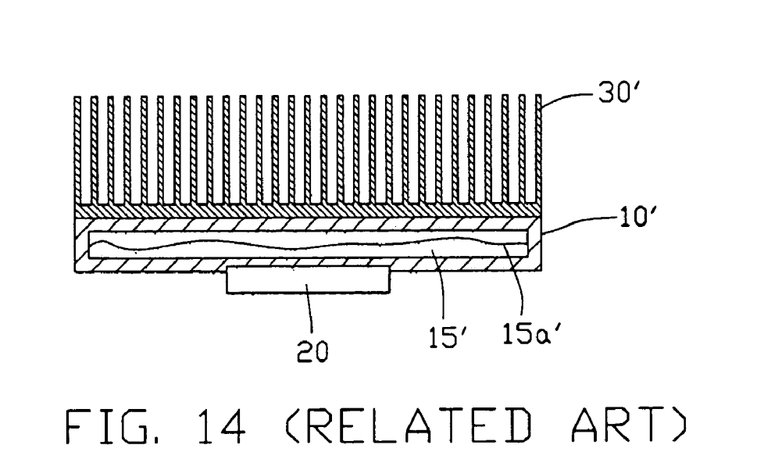
FIG. 14 is a cross section view of the cooling device of FIG. 13, taken along line XIV-XIV.

It is well known that the heat transfer efficiency by phase change of fluid (i.e. from liquid to vapor) is better than other mechanisms, such as heat convection and heat conduction. It is also well known that heat absorbed by fluid having a phase change is ten times more than that the fluid does not have a phase change. Accordingly, recently, cooling devices with boiling chambers have been developed. FIGS. 13-14 show a conventional boiling chamber cooling device which includes a boiling chamber 10' for contacting with a heat generating component 20 and a heat sink 30' mounted on the boiling chamber 10'. The boiling chamber 10' contains therein working fluid 15' which boils when absorbs heat from the heat generating component 20 and transfers the heat to the heat sink 30' via the boiling fluid 15' contacting with a top wall of the chamber 10'. However, in this kind of conventional boiling chamber cooling device, a predetermined space exists between the top wall of the chamber 10' and the top surface 15a' of the fluid 15' so that the fluid 15' must boil and therefore be expanded before it contacts with the top wall of the chamber 10' in order to transfer the absorbed heat to the heat sink 30'. A heat transfer threshold thus exists in the boiling chamber 10' since the predetermined space existing between the top wall of the chamber 10' and the fluid 15' results in the fluid 15' not capabling of transferring heat from the heat generating component 20 to the heat sink 30' before the fluid 15' boils. Furthermore, the fluid 15' generates a locally intensive agitation at an area located just above the heat generating component 20 since it is impossible that heat generated by the heat generating component 20 is spread to the whole bottom surface of the chamber 10' without any delay, which results in a wave formation at the top surface 15a' of the fluid 15' when the fluid 15' boils. Thus, the boiling fluid may not continuously and stably thermally contact with the top wall of the chamber 10'. A detailed description about density-controlling instability is disclosed in the article TRANSPORT PROCESSES IN BOILING AND TWO-PHASE SYSTEMS, HEMISPHERE PUBLISHING CORPORATION, 1976, Washington, Chapter 2 and Section 9.2.2.2, which is incorporated herein by reference. The heat transfer effect of the boiling chamber 10' is therefore reduced. Moreover, the predetermined space existing between the top wall of the chamber 10' and the top surface 15a' of the fluid 15' results in the level of the fluid 15' may be lower than that of the heat generating component 20 when the chamber 10' locates at inclined state, which results in the heat transfer effect of the boiling chamber 10' being significantly reduced.

For the foregoing reasons, therefore, there is a need in the art for a cooling device which overcomes the above-mentioned problems.

SUMMARY

A cooling device includes a boiling chamber containing working fluid therein. The chamber includes a bottom wall for contacting with a heat generating component and a cover hermetically connected with the bottom wall. The cover includes a top wall and a bulge formed at a periphery thereof. The bulge includes a pair of spaced side walls, one of the side walls connecting with the top wall and the other of the side walls connecting with the bottom wall. A buffering region is formed between the side walls, which is capable of absorbing agitation wave generated by boiling fluid to thereby allow the boiling fluid to be capabling of continuously and stably contacting with and exchanging heat from the top wall of the boiling chamber when the fluid boils. A heat sink is arranged on the cover of the boiling chamber for transferring heat from the boiling chamber to environment.

In one aspect of the present invention, a heat transfer enhancing structure is arranged in the chamber. The heat transfer enhancing structure extends from the bottom wall of the chamber to the cover and is capable of transferring heat from the bottom wall to the top wall when the fluid does not contact with the top wall to thereby avoid heat transfer threshold existing in the chamber. Since the heat transfer enhancing structure can transfer heat from the bottom wall to the top wall, the boiling chamber is workable under the condition that the boiling chamber is located at inclined position.

In another aspect of the present invention, the heat sink includes a plurality of spaced fins. A plurality of heat pipes connect upper portions of the fins with the buffering region and are capable of transferring heat from the buffering region to the upper portions of the fins directly. Thus, the fins of the heat sink are effectively used and the heat dissipating efficiency of the cooling device is therefore improved.

Other objects, advantages and novel features of the present invention will be drawn from the following detailed description of a preferred embodiment of the present invention with attached drawings, in which:

DETAILED DESCRIPTION OF PREFERRED EMBODIMENTS

Figure 1:
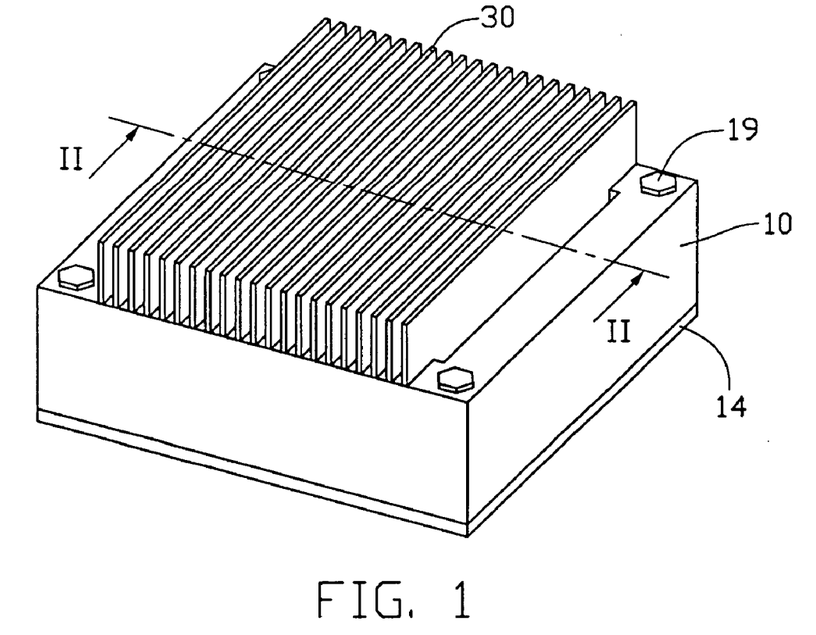
FIG. 1 is an isometric view of a cooling device in accordance with a first embodiment of the present invention.
Figure 2:
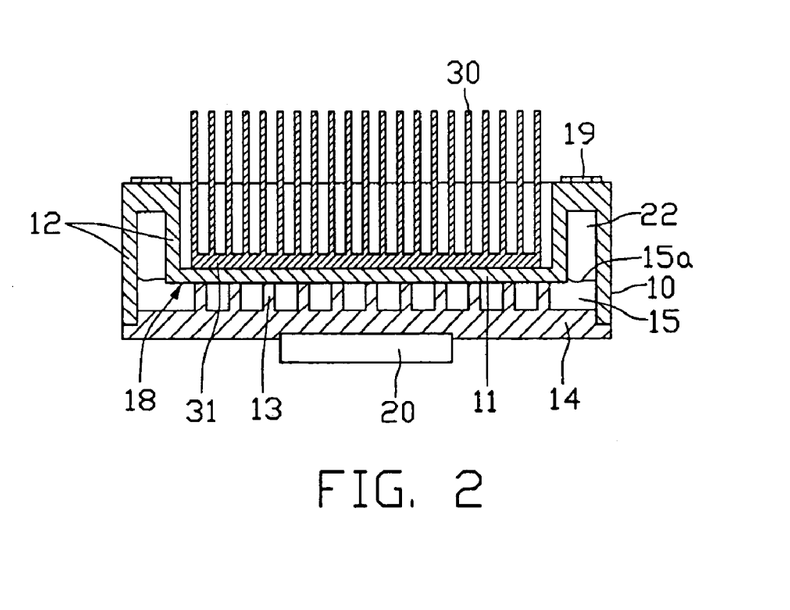
FIG. 2 is a cross section view of the cooling device of FIG. 1, taken along line II-II.

FIGS. 1-2 show a cooling device in accordance with a first embodiment of the present invention. The cooling device comprises a boiling chamber 10 for thermally contacting with a heat generating component 20, and a heat sink 30 arranged on the boiling chamber 10.

The boiling chamber 10 comprises a bottom wall 14 and a cover hermetically connected to the bottom wall 14 to thereby form a sealed space for containing working fluid 15 therein. The cover comprises a top wall 11 parallel to the bottom wall 14 and a bulge formed on a periphery thereof and surrounding the top wall 11. The bulge has an inverted U-shaped cross section and comprises a pair of spaced side walls 12, one of which integrally extends from the top wall 11 and the other of which is hermetically attached to the bottom wall 14. A buffering region 22 is formed between the side walls 12. The buffering region 22 communicates with the space formed between the top wall 11 and the bottom wall 14. A plurality of corners of a top side of the bulge respectively define a plurality of openings (not labeled) through which the air can be drawn out from the chamber 10 and the working fluid 15 can be filled into the chamber 10. Each opening is sealed with a plug 19. The heat sink 30 comprises a base 31 attached on a top surface of the top wall 11, and a plurality of spaced fins extending upwardly from the base 31.

Figure 3A:
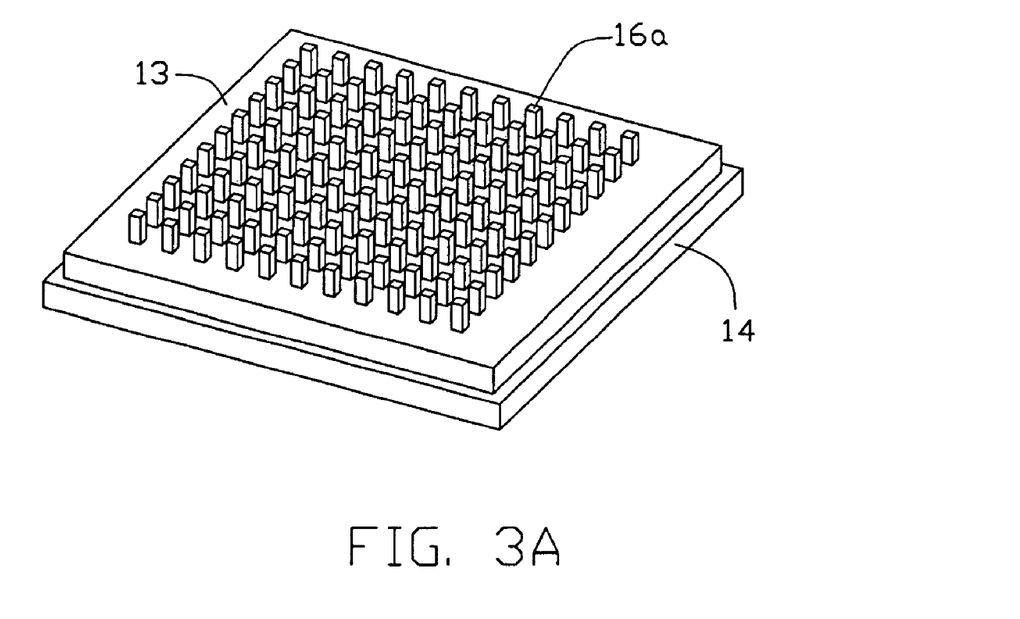
FIG. 3A shows a bottom wall with a heat transfer enhancing structure of FIG. 2 and FIGS. 3B-3D respectively show the bottom wall in accordance with different alternations.
Figure 3B:
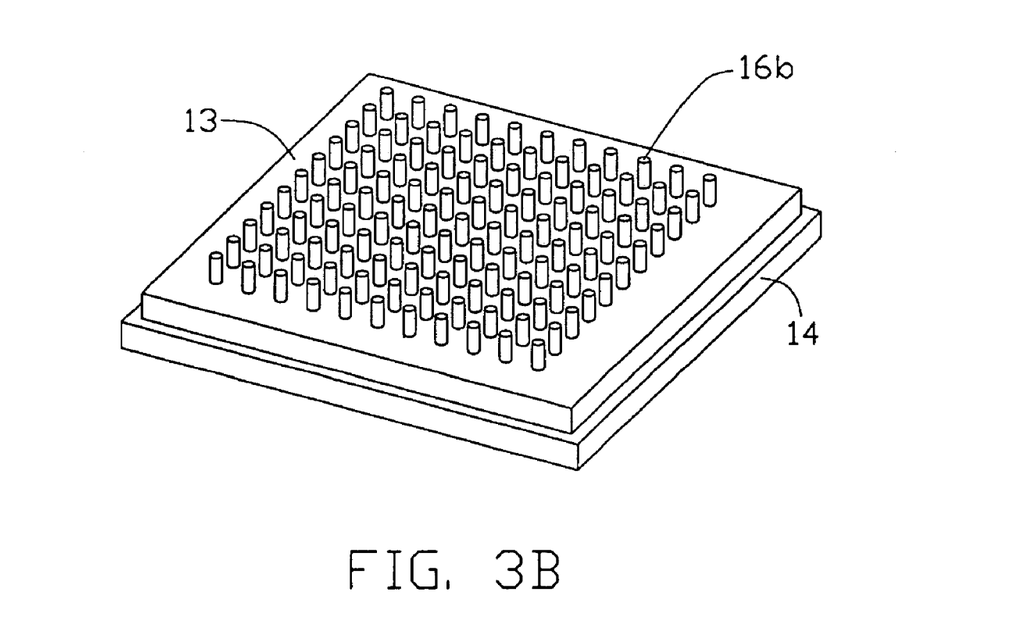
Figure 3C:
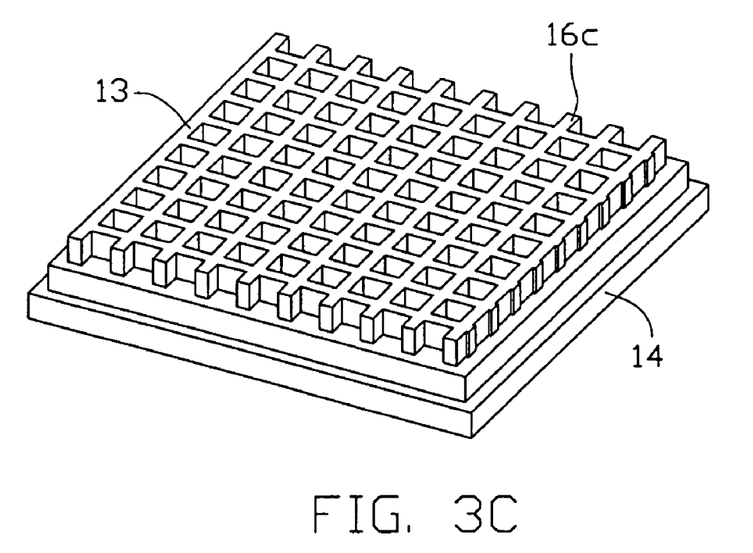
Figure 3D:
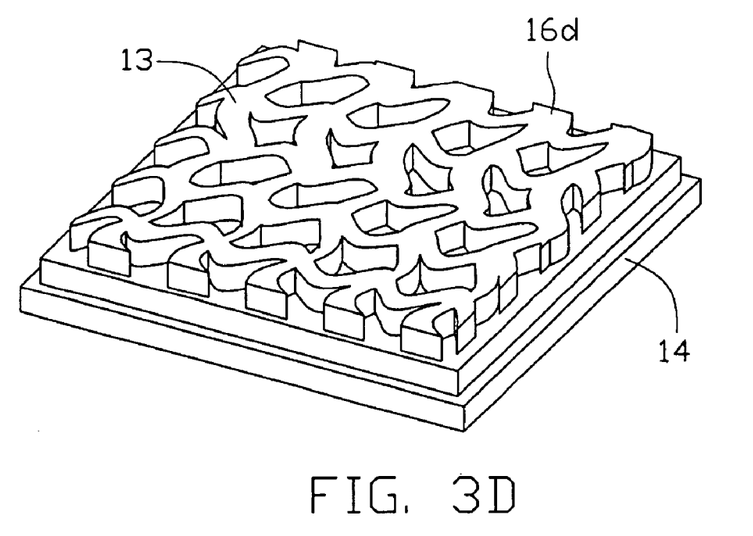

The bottom wall 14 comprises a bottom surface for contacting with and absorbing heat from the heat generating component 20, and a top surface opposing to the bottom surface. A heat transfer enhancing structure 13 is arranged between the top surface of the bottom wall 14 and a bottom surface 18 of the top wall 11. The heat transfer enhancing structure 13 comprises a plurality of heat absorbing units 16a. The heat absorbing units 16a are polygonal as shown in FIG. 3A, and alternatively, they can be column pins 16b as shown in FIG. 3B. In addition, the heat absorbing units can be elongated ribs 16c intersecting with each other as shown in FIG. 3C or curving ribs 16d intersecting with each other as shown in FIG. 3D.

In the first embodiment described above, the heat transfer enhancing structure 13 is immersed in the working fluid 15 which is therefore capable of absorbing heat from the heat transfer enhancing structure 13 to thereby accelerate heat absorbing of the fluid 15 from the bottom wall 14. Furthermore, the heat absorbing units 16 of the heat transfer enhancing structure 13 extend from the top surface of the bottom wall 14 to contact with the bottom surface 18 of the top wall 11 and are capable of transferring heat from the bottom wall 14 to the top wall 11 when a top surface 15a of the fluid 15 does not contact with the bottom surface of the top wall 11 to thereby avoid the threshold of heat transfer from the fluid to the top wall as disclosed in the related art. Since the heat absorbing units 16 can transfer heat from the bottom wall 14 to the top wall 11, the boiling chamber 10 is workable under the condition that the boiling chamber 10 is located at an inclined position. Alternatively, the heat transfer enhancing structure 13 may be arranged between the top wall 11 and the bottom wall 14 with only some of the heat absorbing units 16a-16d contacting with the bottom surface 18 of the top wall 11. Moreover, in a normal working state, the top surface 15a of the fluid 15 is higher than the bottom surface 18 of the top wall 11 due to the existing of the buffering region 22. Furthermore, the buffering region 22 can absorb agitation wave generated by the boiling fluid 15 to thereby avoid instability of contact between the fluid 15 and the bottom surface 18 of the top wall 11. Therefore, when the fluid 15 is boiling, the fluid 15 can continuously and stably contact with and exchange heat from the bottom surface 18 of the top wall 11 of the boiling chamber 10, thereby improving heat dissipation efficiency of the cooling device.

Figure 4:
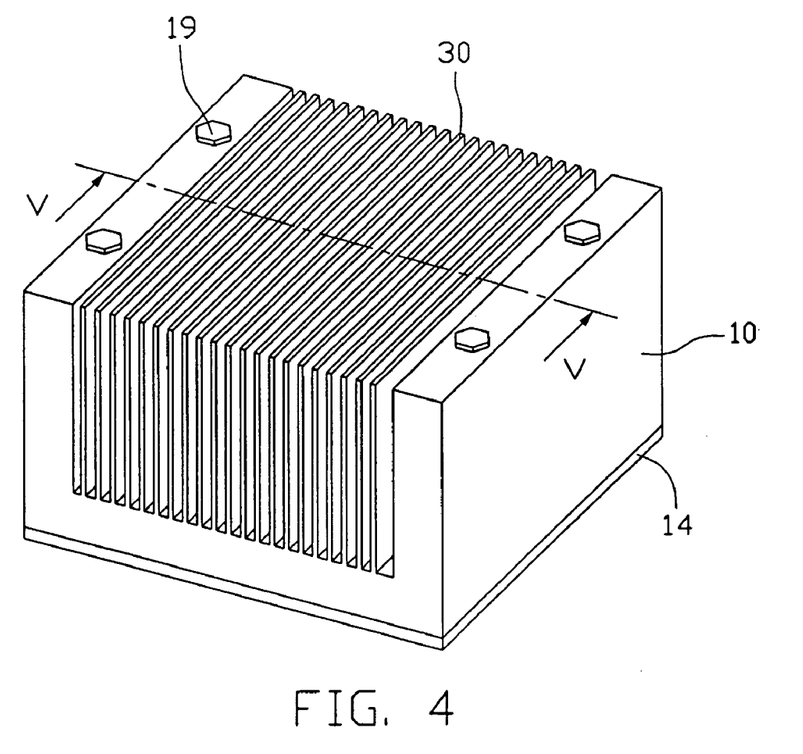
FIG. 4 is an isometric view of a cooling device in accordance with a second embodiment of the present invention.
Figure 5:
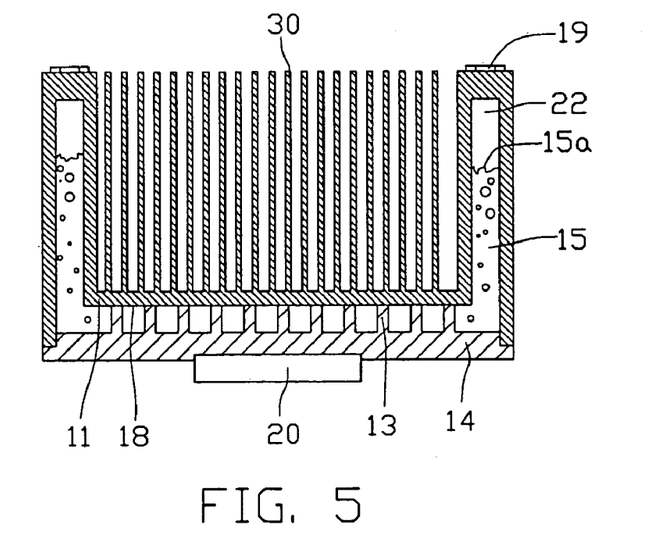
FIG. 5 is a cross section view of the cooling device of FIG. 4, taken along line V-V.

FIGS. 4-5 show a cooling device in accordance with a second embodiment of the present invention. The cooling device of the second embodiment is similar to the cooling device of the first embodiment except that the fins of the heat sink 30 of the cooling device of the second embodiment integrally extend from the top wall 11 of the chamber 10, the buffering region 22 is located at opposite sides of the chamber 10. Thus, the thermal resistance existing between the base 31 of the heat sink 30 and the top wall 11 of the chamber 10 in the first embodiment is eliminated in the second embodiment, which accelerates heat transfer from the boiling chamber 10 to the heat sink 30. Furthermore, the heat sink 30 integrally formed with the cover of the boiling chamber 10 simplifies the process of assembly.

Figure 6:
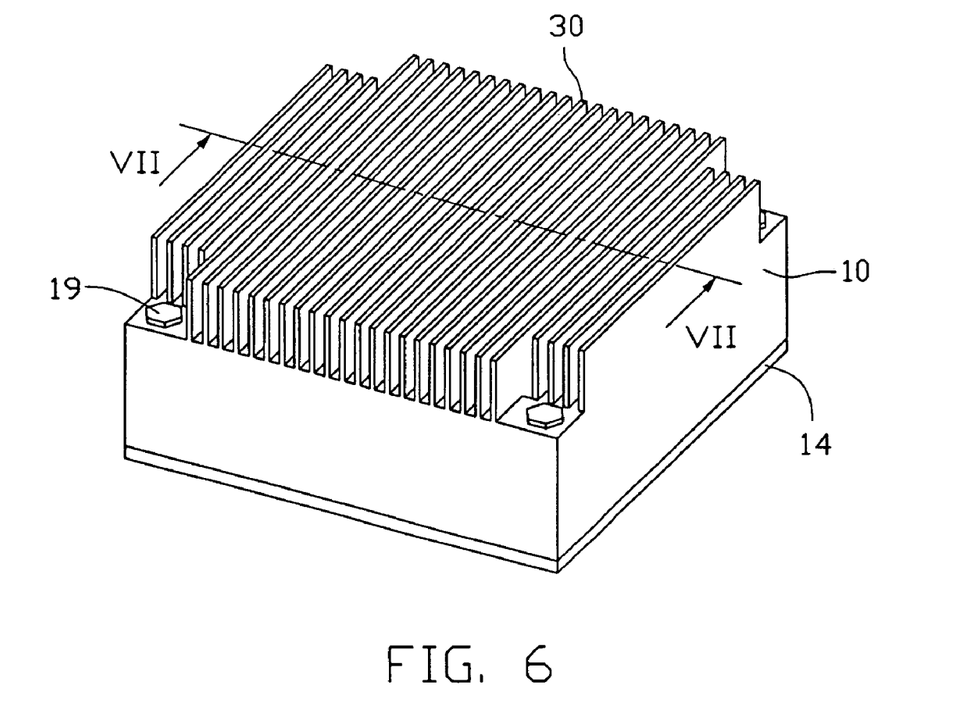
FIG. 6 is an isometric view of a cooling device in accordance with a third embodiment of the present invention.
Figure 7:
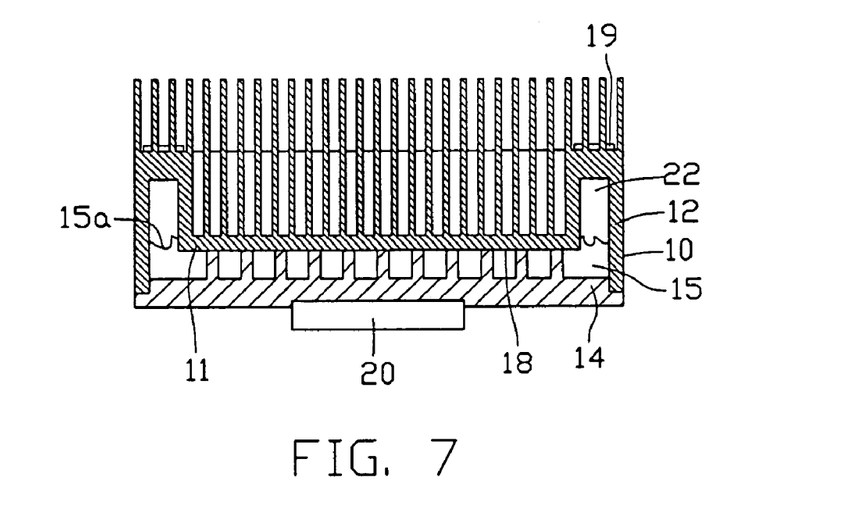
FIG. 7 is a cross section view of the cooling device of FIG. 6, taken along line VII-VII.

FIGS. 6-7 show a cooling device in accordance with a third embodiment of the present invention. The cooling device of the third embodiment is similar to the cooling device of the first embodiment except that the fins of the heat sink 30 of the third embodiment are integrally formed with the cover, which simplifies the process of assembly and eliminate heat resistance existing between the base 31 of the heat sink 30 and the top wall 11 of the chamber 10 as compared with the first embodiment. The buffering region 22 is located at a periphery of the chamber 10 and surrounds the top wall 11 of the chamber 10.

Figure 8:
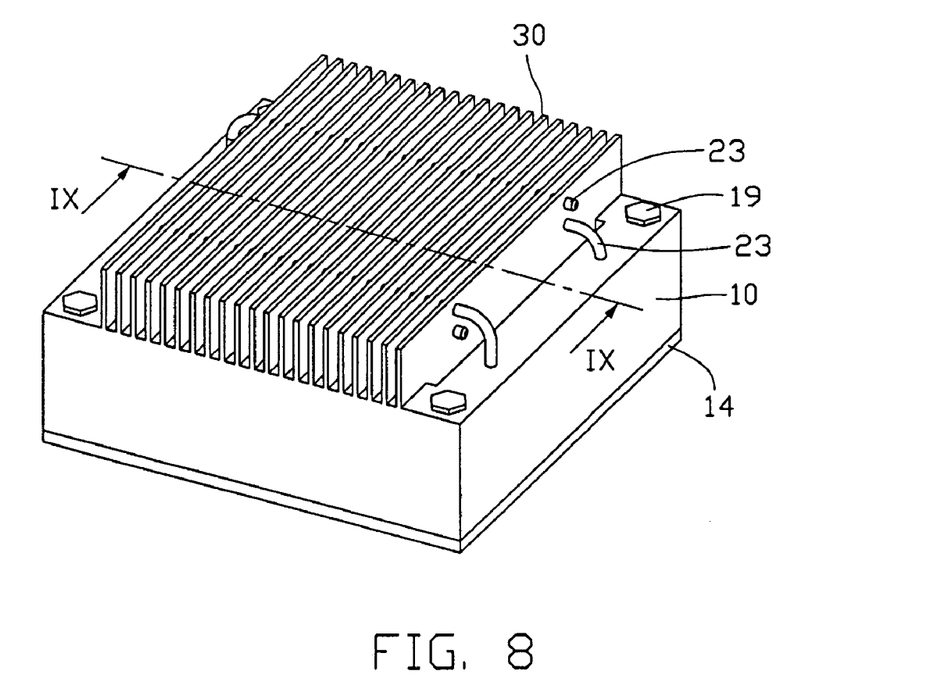
FIG. 8 is an isometric view of a cooling device in accordance with a fourth embodiment of the present invention.
Figure 9:
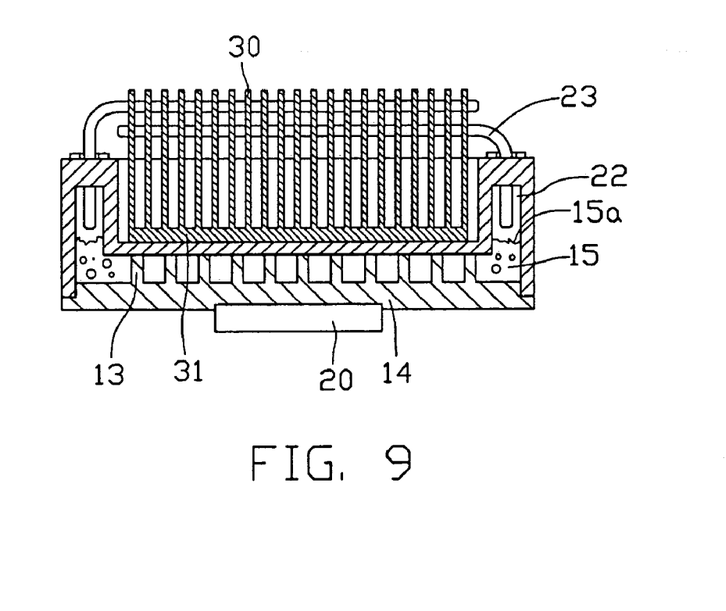
FIG. 9 is a cross section view of the cooling device of FIG. 8, taken along line IX-IX.

FIGS. 8-9 show a cooling device in accordance with a fourth embodiment of the present invention. The cooling device of the fourth embodiment is similar to the cooling device of the first embodiment except that a plurality of heat pipes 23 are used in the fourth embodiment. One end of each heat pipe 23 extends through upper portions of the fins of the heat sink 30 and the other end extends through the top of a corresponding buffering region 22 of the boiling chamber 10. The temperature of the upper portions of the fins of the heat sink 30 is usually lower than that of the bottom portion of the heat sink 30 since heat is transferred from the bottom portion to the upper portion via heat conduction of the fins. In the fourth embodiment, heat pipes 23 are capable of transferring heat from the buffering region 22 to the upper portions of the fins of the heat sink 30 directly. Thus, the fins of the heat sink 30 are effectively used and the heat dissipating efficiency of the cooling device is therefore improved.

Figure 10:
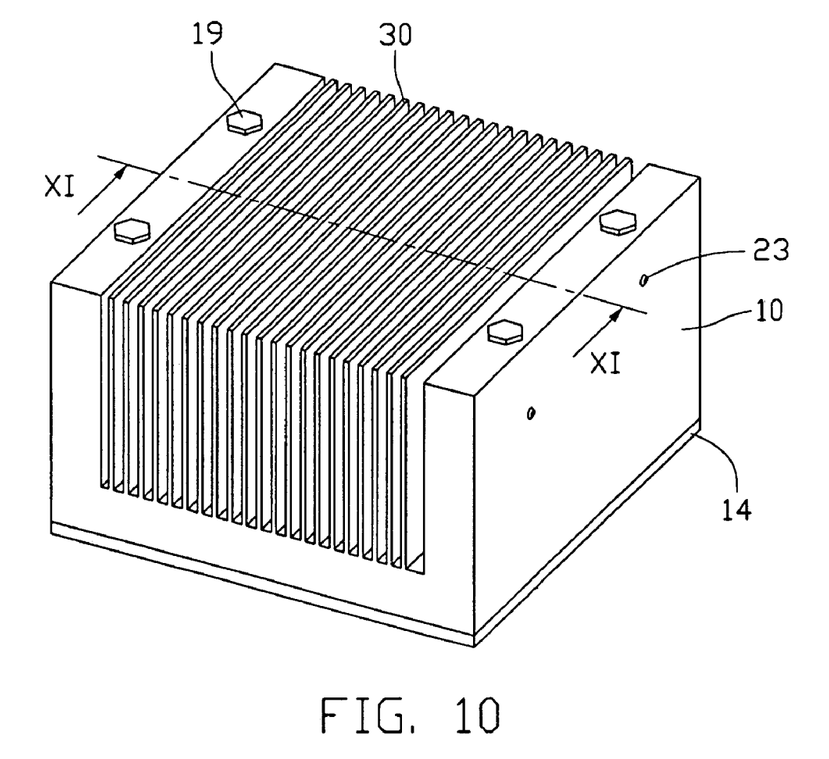
FIG. 10 is an isometric view of a cooling device in accordance with a fifth embodiment of the present invention.
Figure 11:
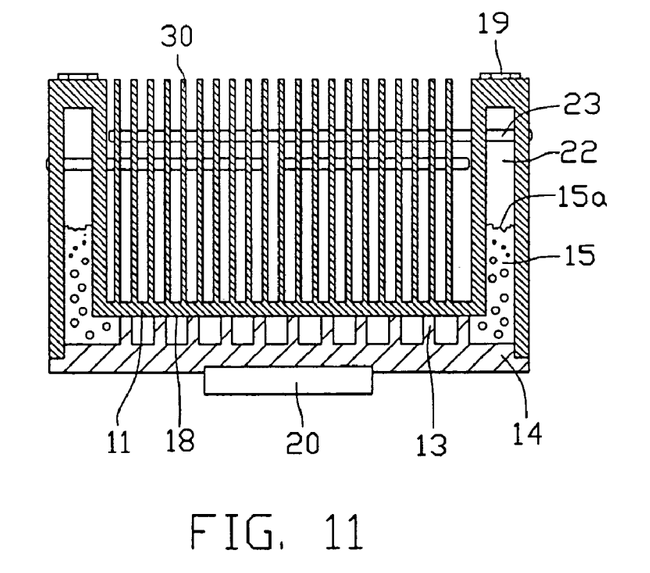
FIG. 11 is a cross section view of the cooling device of FIG. 10, taken along line XI-XI.

FIGS. 10-11 show a cooling device in accordance with a fifth embodiment of the present invention. The cooling device of the fifth embodiment is similar to the cooling device of the second embodiment except that heat pipes 23 are used in the fifth embodiment. One end of each heat pipe 23 extends through upper portions of the fins of the heat sink 30 and the other end extends into a corresponding buffering region 22 of the boiling chamber 10. Thus, the fins of the heat sink 30 are effectively used and the heat dissipating efficiency of the cooling device is therefore improved.

Figure 12:
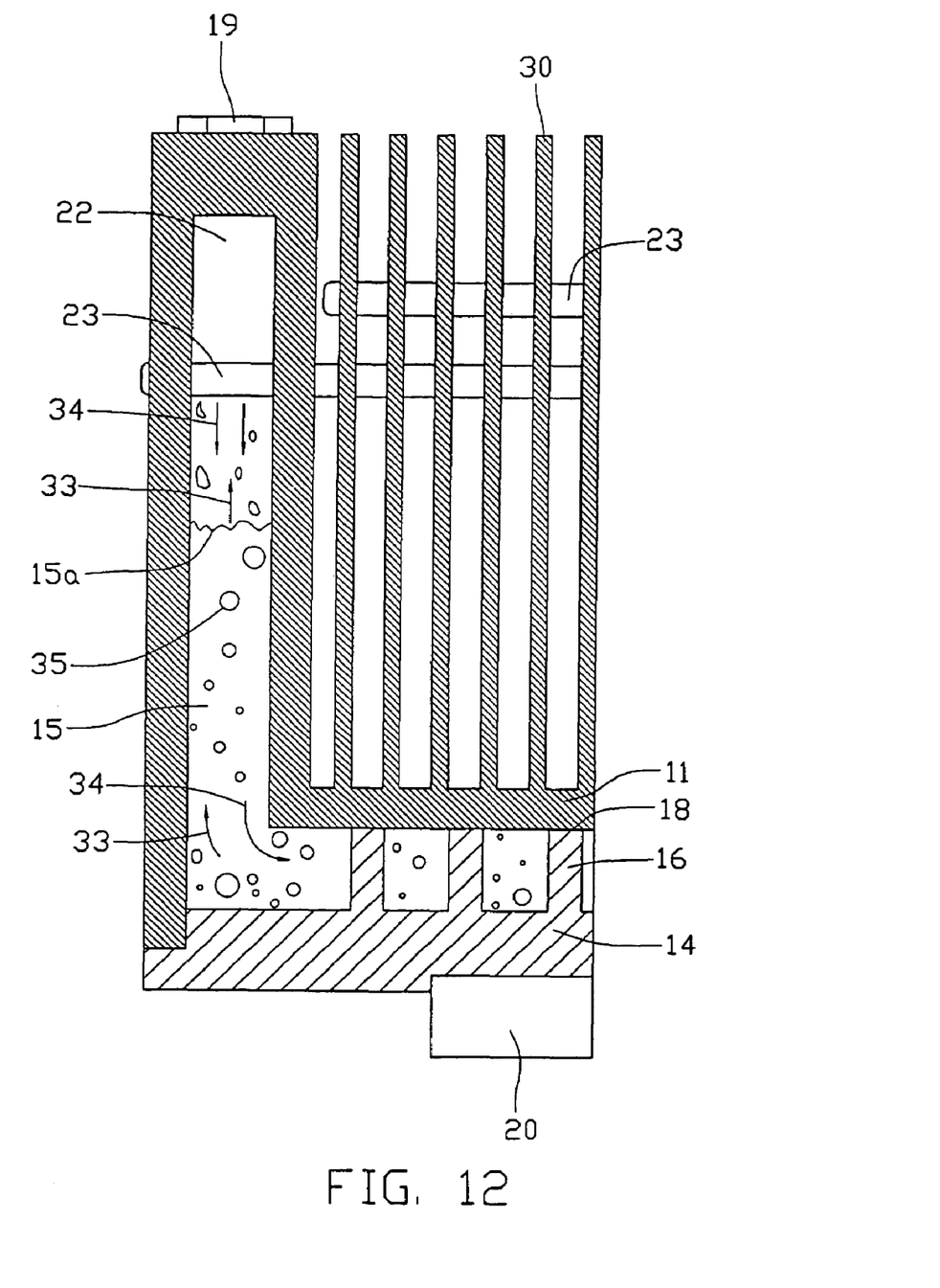
FIG. 12 is an enlarged view of one portion of FIG. 11 showing working principle of the cooling device of the fifth embodiment.

FIG. 12 is an enlarged view of one portion of FIG. 11 showing working principle of the cooling device of the fifth embodiment. When the fluid 15 boils, the vapor bubbles 35 in the fluid 15 move upward as indicated by an arrow 33 in the buffering region 22. When the upward hot vapor encounters and exchanges heat from the heat pipes 23 the upward hot vapor condenses to a liquid state and flows back to the bottom wall 14 of the chamber 10 as indicated by arrows 34 to thereby form a circulation. Thus, the heat pipes 23 are capable of transferring heat from the buffering region 22 to the upper portions of the fins of the heat sink 30 directly. A high temperature region with hot vapor gathering, which is often generated at the upper portion of the buffering region 22 when no heat pipe is used, is therefore avoided. The heat dissipating efficiency of the cooling device is therefore improved.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A cooling device comprising:
    a boiling chamber containing working fluid therein, the chamber comprising a bottom wall for contacting with a heat generating component and a cover hermetically connected with the bottom wall, the cover including a top wall and at least one bulge, the at least one bulge being extended upwardly above the top wall;
    a hollow buffering region defined in the at least one bulge of the cover, the at least one bulge having a top end and a bottom end, the top end being hermetically sealed, the bottom end being open and in fluid communication with the working fluid of the boiling chamber for receiving vapor generated by the working fluid when the working fluid is heated by the heat generating component and boils; and
    a heat sink arranged on and contacted with the top wall of the cover for dissipating heat transferred from the boiling chamber to environment;
    wherein the heat sink comprises a plurality of spaced fins extending upwardly from the top wall of the cover; and
    wherein at least one heat pipe connects an upper portion of at least one of the spaced fins with the buffering region, and a free end of the at least one heat pipe extends into the buffering region.

2. The cooling device as claimed in claim 1, further comprising a heat transfer enhancing structure arranged in the boiling chamber and extending from the bottom wall of the boiling chamber to the cover, the heat transfer enhancing structure being immersed in the working fluid.

3. The cooling device as claimed in claim 2, wherein the heat transfer enhancing structure comprises a plurality of spaced fins at least one of which contacts with the cover.

4. The cooling device as claimed in claim 2, wherein the heat transfer enhancing structure comprises a plurality of elongated ribs intersecting with each other.

5. The cooling device as claimed in claim 2, wherein the heat transfer enhancing structure comprises a plurality of curved ribs intersecting with each other.

6. The cooling device as claimed in claim 1, wherein a height of the fins of the heat sink is not smaller than that of the at least one bulge.

7. The cooling device as claimed in claim 1, wherein the at least one bulge has an inverted U-shaped cross section and comprises a pair of spaced side walls, one of the side walls connecting with the top wall and the other of the side walls connecting with the bottom wall, the buffering region being formed between the side walls.

8. The cooling device as claimed in claim 7, wherein the at least one bulge is located at a periphery of the chamber and surrounds the top wall, a recess is defined above the top wall and surrounded by the at least one bulge, and the heat sink is received in said recess.

9. The cooling device as claimed in claim 8, wherein the heat sink comprises a base attached on the top wall, the a plurality of spaced fins of the heat sink extending from the base.

10. The cooling device as claimed in claim 8, wherein the plurality of spaced fins of the heat sink integrally extend from the cover.

11. The cooling device as claimed in claim 7, wherein the at least one bulge includes two bulges located respectively at two opposite lateral sides of the top wall, a recess being defined between the two bulges and above the top wall, the heat sink being received in said recess.

12. The cooling device as claimed in claim 11, wherein the plurality of spaced fins of the heat sink integrally extend from the cover.

13. A cooling device comprising:
    a boiling chamber comprising a bottom wall for contacting with a heat generating component and a cover connecting with the bottom wall to form a sealed space in which working fluid is contained, the cover comprising a top wall located above the bottom wall and at least one bulge connected with and extended above the top wall, the at least one bulge being located at a periphery of the top wall, a recess being defined above the top wall and surrounded by the at least one bulge, a hollow buffering region defined in the at least one bulge and being in fluid communication with said sealed space;
    a heat transfer enhancing structure extending from the bottom wall upwardly to contact with a bottom surface of the top wall and being immersed in the fluid; and
    a heat sink received in said recess and arranged on and contacted with a top surface of the top wall;
    wherein the top wall is parallel to the bottom wall, and the heat sink comprises a plurality of spaced fins extending upwardly from the top wall of the cover; and
    wherein at least one heat pipe connects an upper portion of at least one of the spaced fins with the buffering region, and a free end of the at least one heat pipe extends into the buffering region.

14. The cooling device as claimed in claim 13, wherein the at least one bulge comprises a pair of spaced side walls, one of the side walls connecting with the top wall and the other of the side walls connecting with the bottom wall, the buffering region being formed between the side walls.

* * * * *

UNITED STATES PATENT AND TRADEMARK OFFICE
CERTIFICATE OF CORRECTION

PATENT NO. : 7,661,463 B2
APPLICATION NO. : 11/166313
DATED : February 16, 2010
INVENTOR(S) : Tay-Jian Liu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 516 days.

Signed and Sealed this

Thirtieth Day of November, 2010

David J. Kappos
*Director of the United States Patent and Trademark Office*